United States Patent
Koguchi et al.

(10) Patent No.: US 7,182,122 B2
(45) Date of Patent: Feb. 27, 2007

(54) HEATING AND COOLING APPARATUS, AND VACUUM PROCESSING APPARATUS EQUIPPED WITH THIS APPARATUS

(75) Inventors: Toshiaki Koguchi, Kunitachi (JP); Kazuhito Watanabe, Tama (JP); Nobuyuki Takahashi, Sagamihara (JP)

(73) Assignee: Anelva Corporation, Tokyo (JP)

( * ) Notice: Subject to any disclaimer, the term of this patent is extended or adjusted under 35 U.S.C. 154(b) by 624 days.

(21) Appl. No.: 09/906,130

(22) Filed: Jul. 17, 2001

(65) Prior Publication Data
US 2002/0017377 A1 Feb. 14, 2002

(30) Foreign Application Priority Data
Aug. 11, 2000 (JP) ............................. 2000-243948

(51) Int. Cl.
*F25B 29/00* (2006.01)
(52) U.S. Cl. ............... 165/48.1; 118/719; 118/724; 118/725
(58) Field of Classification Search ............... 165/48.1, 165/80.1, 80.2; 118/718, 719, 724, 725
See application file for complete search history.

(56) References Cited

U.S. PATENT DOCUMENTS

| | | | | |
|---|---|---|---|---|
| 2,382,432 A * | 8/1945 | McManus et al. | ........... | 427/250 |
| 4,047,624 A * | 9/1977 | Dorenbos | .................... | 414/217 |
| 4,313,254 A * | 2/1982 | Feldman et al. | ............... | 438/72 |
| 4,461,783 A * | 7/1984 | Yamazaki | .................... | 136/258 |
| 4,519,339 A * | 5/1985 | Izu et al. | ..................... | 118/718 |
| 4,666,734 A * | 5/1987 | Kamiya et al. | ............. | 427/569 |
| 5,258,075 A * | 11/1993 | Kurokawa | .................. | 118/719 |
| 5,324,360 A * | 6/1994 | Kozuka | ....................... | 118/719 |
| 5,474,410 A * | 12/1995 | Ozawa et al. | ................ | 118/719 |
| 5,512,320 A | 4/1996 | Turner et al. | | |
| 5,571,749 A * | 11/1996 | Matsuda et al. | ............. | 438/484 |
| 5,607,009 A | 3/1997 | Turner et al. | | |
| 5,799,860 A * | 9/1998 | Demaray et al. | ........... | 228/194 |
| 6,139,695 A * | 10/2000 | Washburn et al. | .......... | 118/719 |
| 6,235,634 B1 * | 5/2001 | White et al. | ................. | 118/719 |
| 6,277,199 B1 * | 8/2001 | Lei et al. | ..................... | 118/719 |
| 6,338,874 B1 * | 1/2002 | Law et al. | ............. | 427/255.18 |
| 6,444,277 B1 * | 9/2002 | Law et al. | ................... | 427/574 |
| 6,688,375 B1 * | 2/2004 | Turner et al. | ............... | 165/48.1 |
| 2003/0029833 A1 * | 2/2003 | Johnson | ....................... | 118/719 |

FOREIGN PATENT DOCUMENTS

JP 06-287754 * 11/1994
JP 2000119848 4/2000

* cited by examiner

*Primary Examiner*—Ljiljana Ciric
(74) *Attorney, Agent, or Firm*—Venable, LLP; James R. Burdett

(57) ABSTRACT

A heating and cooling apparatus with which batch processing is possible and throughput can be increased, and furthermore which is more compact and uses less energy. A substrate heating chamber and a substrate cooling chamber each capable of simultaneously holding a plurality of substrates are provided in a thermally separated state in a heating and cooling apparatus with a single vacuum processing chamber. The substrate heating chamber is equipped with a plurality of communicating or non-communicating substrate holding spaces. The substrate cooling chamber is also equipped with a plurality of communicating or non-communicating substrate holding spaces. The communicating substrate holding spaces allow the batch heat treatment of substrates, while the non-communicating substrate holding spaces allow the batch or individual processing of substrates.

12 Claims, 12 Drawing Sheets

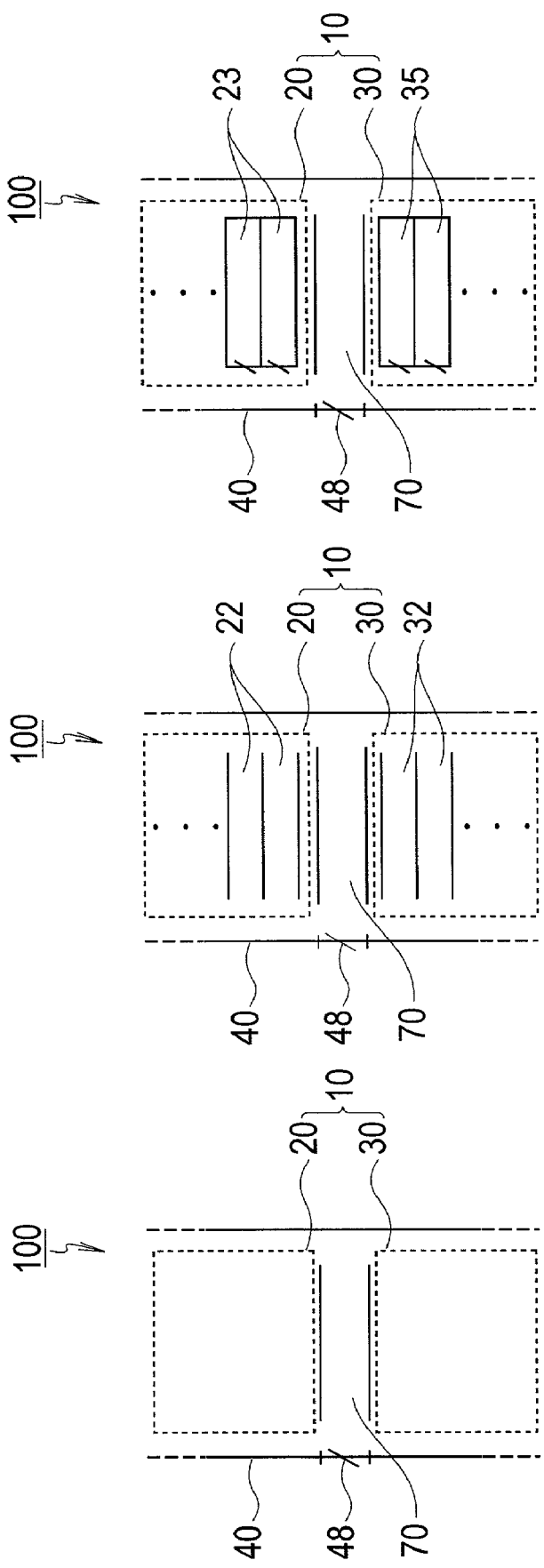

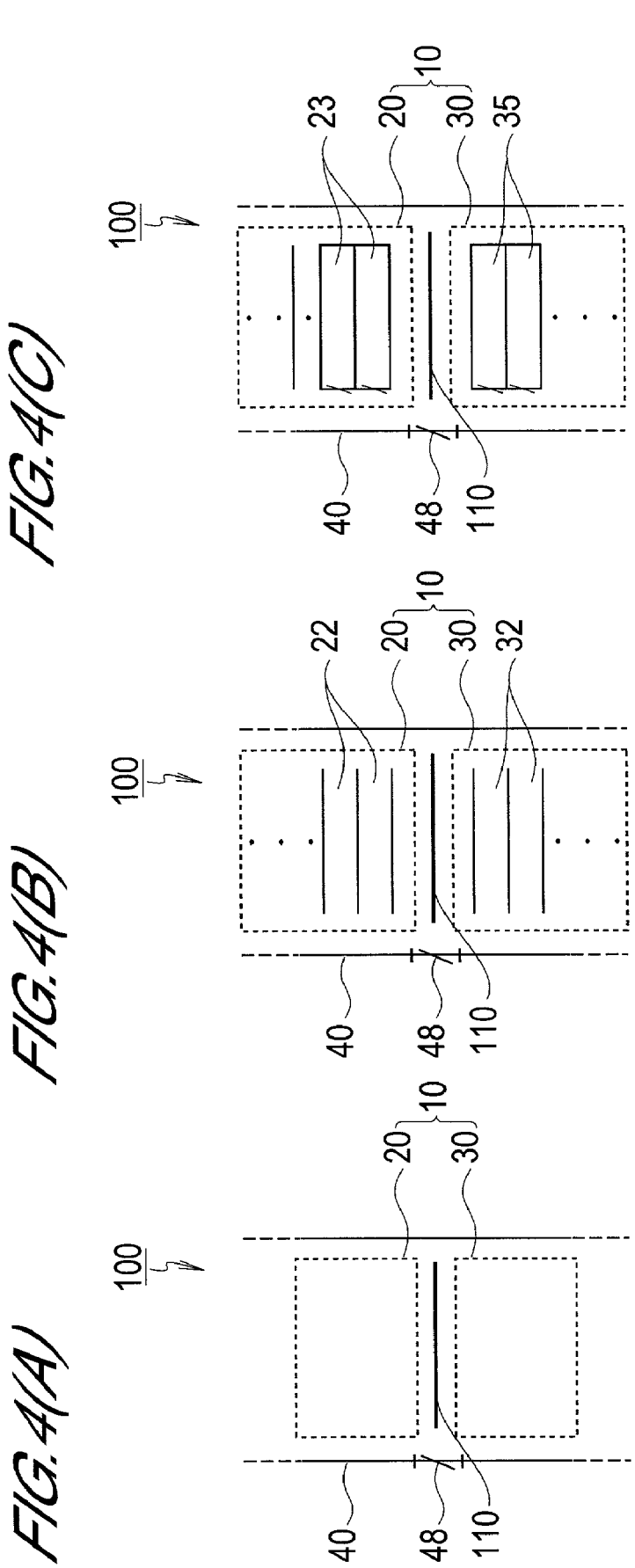

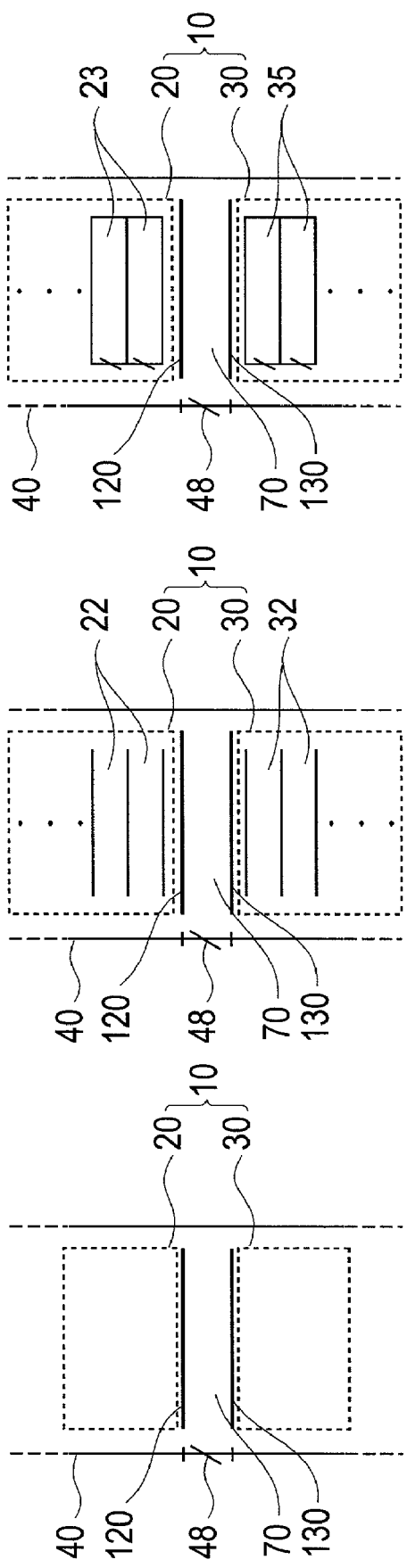

HEATING AND COOLING APPARATUS, AND VACUUM PROCESSING APPARATUS EQUIPPED WITH THIS APPARATUS

BACKGROUND OF THE INVENTION

1. Field of the Invention

The present invention relates to a heating and cooling apparatus attached to a vacuum processing apparatus, and more particularly relates to a heating and cooling apparatus for a vacuum processing apparatus that forms a thin film on a large glass substrate.

2. Description of Related Art

Several different processes have been used to fabricate device structures by forming films of various types on substrates. These processes include heat treatment in which a substrate (also called a wafer) is heated, cooled, or annealed, besides sputtering and other such processes (hereinafter referred to as other processes). In particular, heat treatment involving heating and cooling takes more time than other processes, and if an attempt is made to perform the heating and cooling in a shorter time, this can lead to problems of substrate warpage or damage, and consequently throughput could not be raised any further.

In view of this, as disclosed in Japanese Patents 2,575,285 and 2,766,774, apparatus have been proposed in the past in which a heating chamber and a cooling chamber are each provided independently of other process chambers, and substrates that require heat treatment, such as heating or cooling, can be subjected to heating or cooling treatment in parallel while substrate processing is being performed in the other process chambers.

Meanwhile, Japanese Laid-Open Patent Application 2000-119848 discloses a vacuum film formation apparatus in which the interior of one loading/unloading chamber (corresponds to a load-lock/unload-lock chamber) is partitioned into a loading section and an unloading section, a heating means is provided to the loading section, and a cooling means is provided to the unloading section.

However, with the prior art disclosed in Japanese Patents 2,575,285 and 2,766,774, the heating and cooling of the substrates are performed separately in chambers (vacuum processing chambers) that are independently provided. Consequently, while the batch processing of substrates is possible in these heating-only and cooling-only chambers, because they are independently provided, they make the apparatus bulkier, and the apparatus therefore takes up more installation space. Also, while the batch processing of substrates is indeed possible with these dedicated chambers, because the substrate processing temperature inside each chamber is controlled to the same predetermined temperature, only substrates subject to the same processing conditions can be treated in batches.

Also, when it is necessary to increase the number of chambers, the amount of installation space taken up also increases, and the apparatus itself consumes more power, and this is contrary to the need to make an apparatus more compact and energy-efficient.

With the loading and unloading sections disclosed in Japanese Patent Application Laid-Open No. 2000-119848, only one substrate can be treated at a time in either chamber, and therefore only one substrate can be heated and one cooled (maximum total of two substrates) can be treated simultaneously in a single loading/unloading chamber, and batch processing, involving numerous substrates treated at the same time, cannot be performed in the heating and cooling treatments.

SUMMARY OF THE INVENTION

The first object of this invention is to provide a heating and cooling apparatus with which batch processing involving simultaneous heating and cooling in the same vacuum processing chamber is possible and throughput can be increased, and furthermore which is more compact uses less energy.

The second object of this invention is to provide a heating and cooling apparatus with which the heat treatment temperatures for various substrates are set independently and batch processing involving simultaneous heating and cooling in the same vacuum processing chamber is possible and throughput can be increased, and furthermore which is more compact uses less energy.

The third object of this invention is to provide a vacuum processing apparatus equipped with either of the above-mentioned heating and cooling apparatus.

In order to achieve the stated objects, the heating and cooling apparatus of this invention comprises a substrate heating chamber (or section) and a substrate cooling chamber (or section) as substrate heat treatment chambers (or sections) in a single vacuum processing chamber.

With this structure, a substrate heating chamber and a substrate cooling chamber are provided independently inside a single vacuum processing chamber that is separate from the vacuum processing chamber in which other processes are performed. Therefore, numerous substrates to be batch treated can be placed in the substrate heating chamber and the substrate cooling chamber and subjected to heating and cooling separately from, but in parallel with, the other processes, and this simultaneous heating and cooling can be carried out within a single vacuum processing chamber. Also, since the other processes are carried out in a separate chamber from the heating and cooling of the substrates, there is an increase in throughput and there is less contamination of the substrates. Also, because the substrate heating chamber and the substrate cooling chamber are provided independently inside a single vacuum processing chamber that is separate from the vacuum processing chamber in which other processes are performed, not only is the heating and cooling apparatus more compact and energy-efficient, but so is the vacuum processing apparatus equipped with this apparatus.

In a preferred embodiment of this invention, a substrate transportation chamber (or section) used for substrates that require no heating and cooling is provided between the substrate heating chamber and the substrate cooling chamber.

With this structure, substrates that require no heating and cooling can be shunted to the substrate transportation chamber of the vacuum processing chamber, or moved to the outside via this substrate transportation chamber, which allows the apparatus to be even more compact.

In an embodiment of this invention, it is preferable if the substrate heating chamber and the substrate cooling chamber are thermally shielded from one another within the vacuum processing chamber.

This structure allows the heating and cooling of the substrates to be controlled more accurately.

Also, in an embodiment of this invention, it is preferable if the substrate heating chamber and the substrate transportation chamber are thermally shielded from one another within the vacuum processing chamber, and the substrate cooling chamber and the substrate transportation chamber are thermally shielded from one another within the vacuum processing chamber.

This structure keeps the substrates that require no heating or cooling from being affected by the heat treatments conducted in the substrate heating chamber and the substrate cooling chamber. Furthermore, it minimizes the effect of temperature that the substrates requiring no heating or cooling have on the substrates that do require heating or cooling.

Also, in an embodiment of this invention, it is preferable if the substrate that is treated in the substrate heating chamber is a glass substrate. In this case, a liquid crystal device can be formed from this glass substrate in a short time and at a good yield.

In a preferred embodiment of this invention, the substrate heat treatment chamber is equipped with at least one suitable opening and closing means for transporting the substrates in and out, such as an opening or an openable and closable door (or plate).

In yet another preferred embodiment of this invention, a suitable opening and closing means for transporting the substrates in and out, such as an openable and closable door or a gate valve, is provided to the substrate heating chamber and to the substrate cooling chamber.

With this structure, substrate heat treatment, vacuum controlling, and other required processing can be suitably performed apart from an adjacent vacuum processing chamber or separation chamber for other processes such as deposition (or film formation) and etching.

In another preferred embodiment of this invention, the substrate heating chamber and/or the substrate cooling chamber is divided into a plurality of substrate holding spaces (or sections) that communicate with one another.

With this structure, the various substrate holding spaces can be set to the same temperature, which means that the substrates being heated can be batch treated at substantially the same temperature setting, or the temperature of the individual substrates can be controlled by adjusting the residence time for each substrate individually. Similarly, the substrates being cooled can be batch treated at substantially the same temperature setting. Therefore, the heat treatment of substrates with the same processing conditions can be carried out under the same conditions, so throughput can be increased even more.

With yet another preferred embodiment of this invention, the substrate heating chamber and/or the substrate cooling chamber is furnished with a plurality of substrate holding spaces that do not communicate with one another.

In another preferred embodiment of this invention, there is provided heating and cooling control means for enabling the simultaneous heating of all the substrates held in the communicating substrate holding spaces of the substrate heating chamber and/or the simultaneous cooling of all the substrates held in the communicating substrate holding spaces of the substrate cooling chamber.

With this structure, the temperature of the substrate heat treatment can be set to a suitable temperature that is common to the batch heating and that is common to the batch cooling, and these temperatures can be set independently and simultaneously, so throughput can be increased even more.

In a preferred embodiment of this invention, there is provided a heating and cooling control means for enabling the individual heating of substrates held in the non-communicating substrate holding spaces of the substrate heating chamber and/or the individual cooling of substrates held in the non-communicating substrate holding spaces of the substrate cooling chamber.

In yet another preferred embodiment of this invention, the substrate heating chamber and the substrate cooling chamber are divided vertically and/or horizontally.

Either this individual heat treatment or this individual division will allow the temperature to be controlled for individual substrates held in the substrate heating chamber, and allows the temperature to be controlled for individual substrates held in the substrate cooling chamber, so throughput can be increased even more.

It is also preferable if the substrates can be supported by a substrate support while being held in the substrate heating chamber and/or the substrate cooling chamber.

The heating and cooling apparatus constituted by all or some of the preferred structural examples given above may be favorably provided to a vacuum processing apparatus. With such a vacuum processing apparatus, batch processing involving simultaneous heating and cooling is possible in the same vacuum processing chamber, which increases throughput, and furthermore makes the apparatus more compact and energy-efficient. It is also possible in this case to set the heating temperature of the substrates to be batch treated to the same or individual temperatures, and to set the cooling temperature of the substrates to be batch treated to the same or individual temperatures. Such temperature control affords an even higher throughput.

BRIEF DESCRIPTION OF THE DRAWINGS

The foregoing and other objects, features and advantages of the present invention will be better understood from the following description taken in connection with the accompanying drawings, in which:

FIG. 3 (including FIG. 3(A), FIG. 3(B), and FIG. 3(C)) consists of schematic diagrams illustrating the features of structural examples of the heating and cooling apparatus of this invention;

FIG. 4 (including FIG. 4(A), FIG. 4(B), and FIG. 4(C)) consists of schematic diagrams illustrating the features of structural examples of the heating and cooling apparatus of this invention;

FIG. 5 (including FIG. 5(A), FIG. 5(B), and FIG. 5(C)) consists of schematic diagrams illustrating the features of structural examples of the heating and cooling apparatus of this invention;

DESCRIPTION OF THE PREFERRED EMBODIMENTS

Figure 1A:
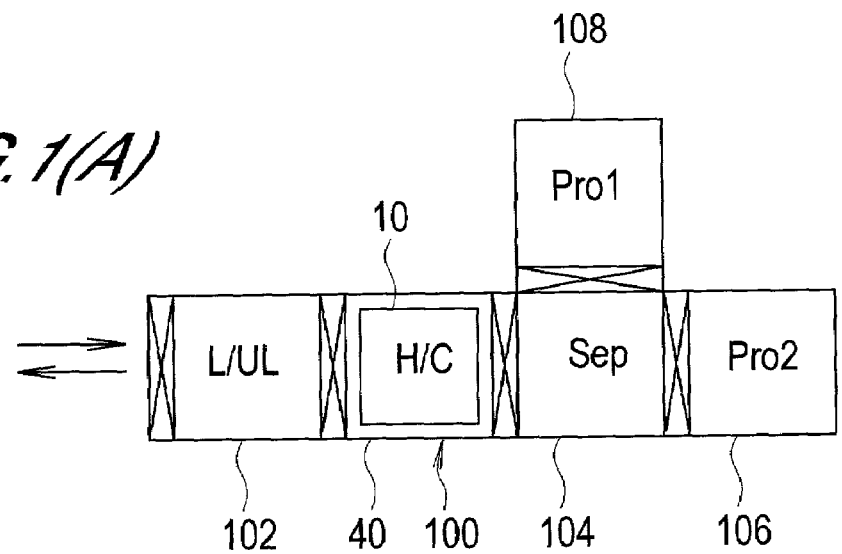
FIG. 1 (including FIG. 1(A), FIG. 1(B), and FIG. 1(C)) consists of schematic diagrams illustrating structural examples of a vacuum processing apparatus that incorporates the heating and cooling apparatus of this invention.

With reference to drawings, a detailed description will hereinafter be given to the heating and cooling apparatus according to the present invention, and the vacuum processing apparatus having incorporated the same therein. The drawings merely give a simplified depiction of the size, shape, and dispostional relationships of the various structural components to the extent that this invention can be understood, and are not intended to limit this invention in any way to the examples in these drawings.

First, a basic structural example of the vacuum processing apparatus to which this invention is applied will be briefly described.

Typical examples of known vacuum processing apparatus include a single-wafer sputtering apparatus and an inline CVD apparatus. With a single-wafer processing apparatus, all or the required portion of vacuum processing chambers such as a loading chamber, a plurality of sputtering-use vacuum processing chambers, a heat treatment-use vacuum processing chamber, a stand-by chamber, and an unloading chamber are arranged in a specific order around a separation chamber. With an inline processing apparatus, all or the required portion of vacuum processing chambers such as a loading chamber, a plurality of sputtering-use vacuum processing chambers, a heat treatment-use vacuum processing chamber, a stand-by chamber, and an unloading chamber are arranged in a specific order. As is commonly known, a substrate is sent from the loading chamber to the required vacuum processing chamber, and once the required processing is completed, the substrate is finally removed to the outside from the unloading chamber. The transport of the substrate during this time is accomplished with a known transportation mechanism. It is also commonly known that heat treatment (heating or cooling) of a substrate is performed in the heat treatment-use vacuum processing chamber before and after deposition processing on the substrate or between deposition processings. The holding of the substrate in this heat treatment-use vacuum processing chamber, and is removal and transport therefrom, are also carried out by robot.

Also, as disclosed in Japanese Patents 2,575,285 and 2,766,774, when the substrate holding cassette provided to the heat treatment-use vacuum processing chamber is divided into a plurality of cells, each cell must be appropriately positioned facing the gate valve of the vacuum processing chamber, so an elevator apparatus is provided for moving this substrate holding cassette up and down. Each cell is moved to this position, the gate valve of the vacuum processing chamber is opened, and a substrate is loaded into or unloaded from the corresponding cell.

The specific structure and operation of the conventional structural elements discussed above are known, and unless there is a particular need, the detailed description of these will be omitted herein.

With the heating and cooling apparatus of this invention, only the substrate heating chamber and substrate cooling chamber for the heat treatment of substrates requiring no heating or cooling are provided as substrate heat treatment chambers within a single vacuum processing chamber.

The structural characteristics of this invention will now be described through reference to FIGS. 1 to 10. FIGS. 1(A), (B), and (C) diagrams illustrating structural examples of the vacuum processing apparatus of this invention. FIGS. 2 to 6 are simplified diagrams illustrating some of the features of this invention. FIGS. 7 to 10 are simplified schematic diagrams illustrating the structure of a heating and cooling apparatus.

First, the vacuum processing apparatus shown in FIG. 1(A) is a single-wafer processing apparatus, in which a heating and cooling apparatus 100 and first and second sputtering-use vacuum processing chambers (Pro1 and Pro2) 108 and 106 are arranged adjacent to a separation chamber (Sep) 104 equipped with a transportation mechanism.

This heating and cooling apparatus 100 has a vacuum processing chamber 40 and a substrate heat treatment chamber 10 located inside the chamber 40 and consisting of a substrate heating chamber and a substrate cooling chamber (H/C). A loading chamber (in this case, this includes both loading and unloading, and is therefore labeled L/UL) 102 is disposed adjacent to this vacuum processing chamber 40 for substrate heat treatment.

The loading chamber 102 and the vacuum processing chamber 40, the vacuum processing chamber 40 and the separation chamber 104, and the separation chamber 104 and the vacuum processing chambers 106 and 108 are each separated by gate valves so as to allow the substrates to be moved in and out.

The substrate processing in a vacuum processing chamber such as this usually involves heating followed by deposition, which is followed by cooling. Naturally, this order can be varied as needed.

With the vacuum processing apparatus in the structural example shown in FIG. 1(A), after being transported to the loading chamber 102, the substrate is transported to a vacuum heating chamber or section of the vacuum processing chamber 40 having the substrate heat treatment chamber or section 10 (this chamber 40 is also called a heat treatment-use vacuum treatment chamber) after the loading chamber has been pumped to the required pressure. After being heated to the required temperature in the vacuum heating chamber or section, the substrate is transported to the separation chamber 104. The substrate is sent from this separation chamber 104 to the first vacuum processing chamber 108 for the required deposition processing. In some cases, the substrate is subjected to deposition or film formation after first being heated or cooled to the required temperature by a heating mechanism of the first vacuum processing chamber 108. Upon completion of the processing in the first vacuum processing chamber 108, the substrate is returned to the separation chamber 104. When the processing conditions are such that deposition is to be carried out in the second vacuum processing chamber 106 immediately after the processing in the first vacuum processing chamber 108, the substrate is accordingly sent to and processed in the second vacuum processing chamber 106. Alternatively, when the processing conditions are such that the substrate is transported to the second vacuum processing chamber 106 after first being heated or cooled, the substrate is first transported to the vacuum processing chamber 40, where the substrate is heat treated at the required temperature, after which it is transported back through the separation chamber 104 to the second vacuum processing chamber 106, where deposition is performed. Upon completion of the processing in the second vacuum processing chamber, the substrate is returned to the vacuum processing chamber 40 through the separation chamber 104. If cooling is necessary at this point, the substrate is cooled to the required temperature in the substrate cooling chamber inside the vacuum processing chamber 40. If no cooling is needed, then the substrate is returned to the loading chamber 102 through the substrate transportation part of the vacuum processing chamber.

Figure 1B:
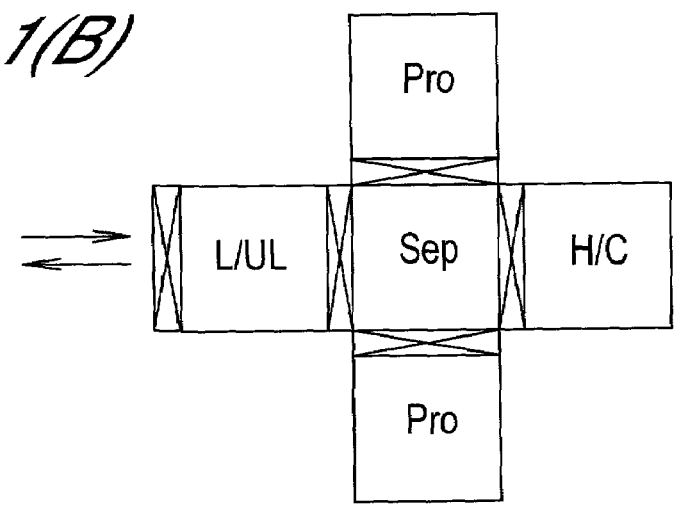

FIGS. 1(B) and (C) are diagrams of other structural examples of a vacuum processing apparatus. In the structural example shown in FIG. 1(B), the separation chamber is disposed between two vacuum processing chambers for deposition, sputtering, or the like, and this separation chamber is disposed between the loading chamber and the vacuum processing chamber having a substrate heat treatment chamber.

Figure 1C:
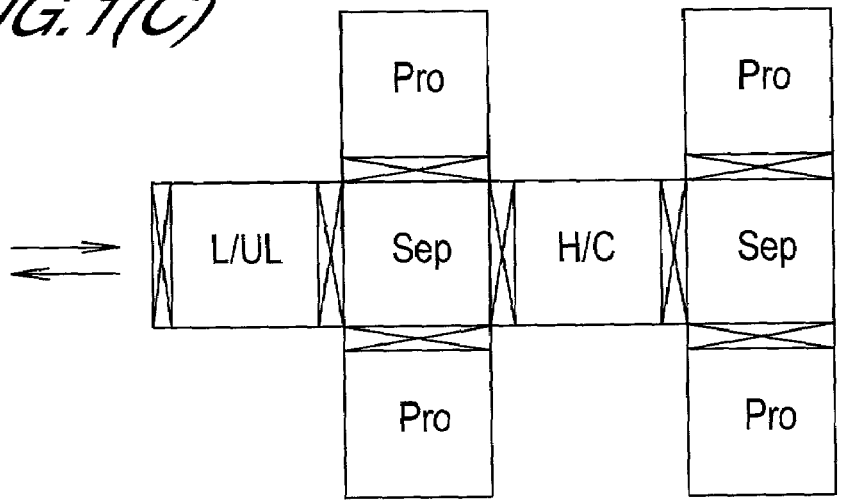

In the structural example shown in FIG. 1(C), there are provided two sets in which the separation chamber is disposed between two vacuum processing chambers for deposition, sputtering, or the like, and the arrangement order is as follows: loading chamber, first separation chamber, vacuum processing chamber having a substrate heat treatment chamber, and second separation chamber.

The features of the substrate heat treatment chamber 10 discussed above will now be briefly described through reference to FIGS. 1 to 6. In the structural examples shown in these drawings, the vacuum processing chamber 40 and the gate valve 48 provided to this vacuum processing chamber 40 have conventional structures. Also, in the structural examples shown in these drawings, the substrate heat treatment chamber 10 is able to move up and down within the vacuum processing chamber 40, and since the movement means is a known means, it is not shown. In FIGS. 2 to 6, the positional relationship between the vacuum processing chamber 40 and the substrate heat treatment chamber 10 on the inside is shown as an appropriate positional relationship, and therefore, to move the substrate out after its heat treatment, the substrate heat treatment chamber 10 is moved either up or down so that the substrate is brought to the position across from the gate valve 48 of the vacuum processing chamber 40, and is then transported out.

The heating and cooling means in the structural examples shown in FIGS. 2 to 6 are neither shown nor described, although these will be discussed later.

Figure 2C:
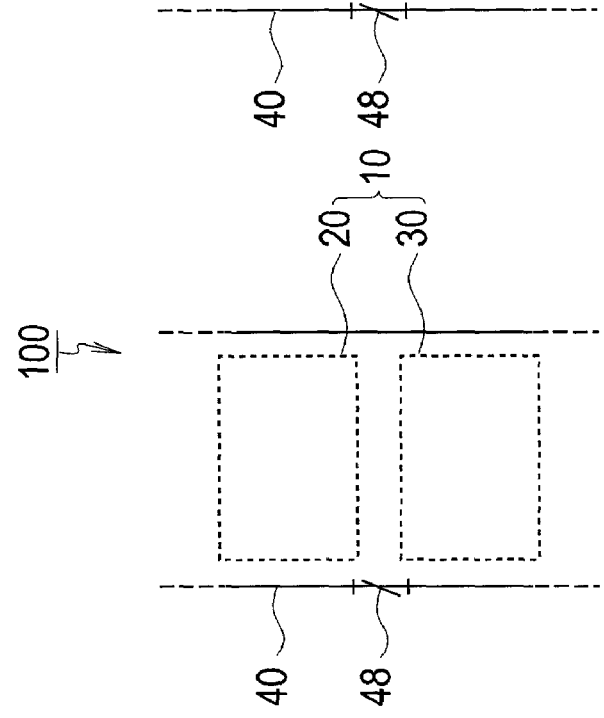
FIG. 2 (including FIG. 2(A), FIG. 2(B), and FIG. 2(C)) consists of schematic diagrams illustrating the features of structural examples of the heating and cooling apparatus of this invention.
Figure 2B:
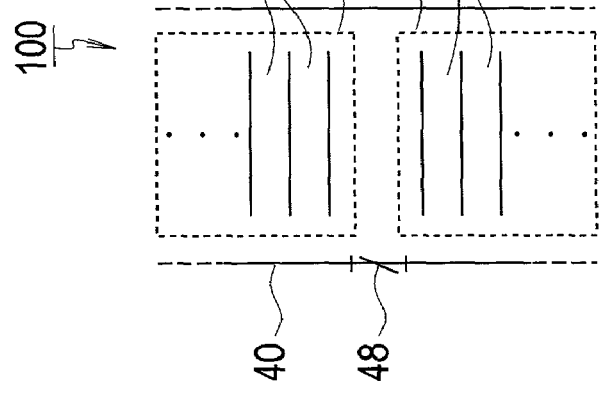
Figure 2A:
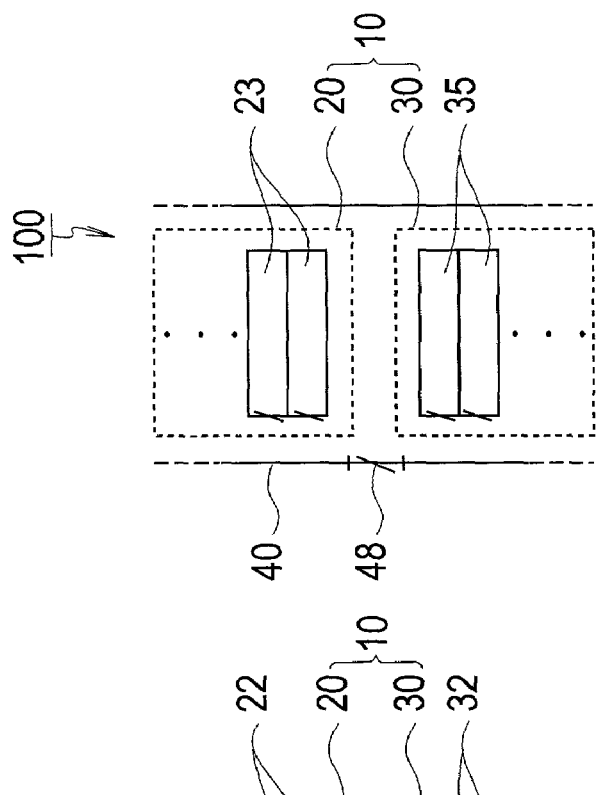

With this invention, as shown in FIG. 2(A), the substrate heat treatment chamber 10 of the heating and cooling apparatus 100 is equipped with a substrate heating chamber or section 20 and a substrate cooling chamber or section 30 (shown in the drawings as regions bounded by a dotted line) inside the vacuum processing chamber 40.

Alternatively, as shown in FIG. 3(A), a substrate transportation chamber or section 70 for substrates that require no heating or cooling can be provided between the substrate heating chamber 20 and the substrate cooling chamber 30.

Alternatively, as shown in FIG. 4(A), a shielding means 110 may be provided for thermally shielding the substrate heating chamber 20 and the substrate cooling chamber 30 from each other inside the vacuum processing chamber 40.

Furthermore, as shown in FIG. 5(A), in this invention a shielding means 120 for thermally shielding the substrate heating chamber 20 and the substrate transportation chamber 70 from each other, and a shielding means 130 for thermally shielding the substrate cooling chamber 30 and the substrate transportation chamber 70 from each other can be provided inside the vacuum processing chamber 40.

Also, in some cases, as shown in FIGS. 2(B), 3(B), 4(B), 5(B), and 6(A), the substrate heating chamber 20 and/or the substrate cooling chamber 30 can be divided into a plurality of substrate holding spaces or sections 22 and 32 that communicate with each other.

Also, in some cases, as shown in FIGS. 2(C), 3(C), 4(C), 5(C), and 6(B), the substrate heating chamber 20 and/or the substrate cooling chamber 30 can be divided into a plurality of substrate holding spaces or sections 23 and 35 that do not communicate with each other.

Furthermore, in a structural example of this invention, the substrate heat treatment chamber 10 is furnished with a gate valve as an opening and closing means or an opening for transporting substrates in and out. In the structural example shown in FIG. 6(A), a stationary vertical divider 150 that extends in the up and down direction (also referred to as the perpendicular or vertical direction) inside the vacuum processing chamber 40, and an opening 152 for allowing substrates to be transported in and out is provided at one place, at a location across from the gate valve 48. Therefore, the portion of the vertical partition or divider 150 other than this opening 152 serves as a side wall that separates the communicating substrate holding spaces 22 and 32 from the other substrate holding spaces on at least one side. Naturally, the vertical divider 150 may be formed cylindrically and provided so that it completely surrounds the substrate holding spaces 22 and 32. This vertical divider can, of course, be similarly provided to the non-communicating substrate holding spaces.

Figure 6A:
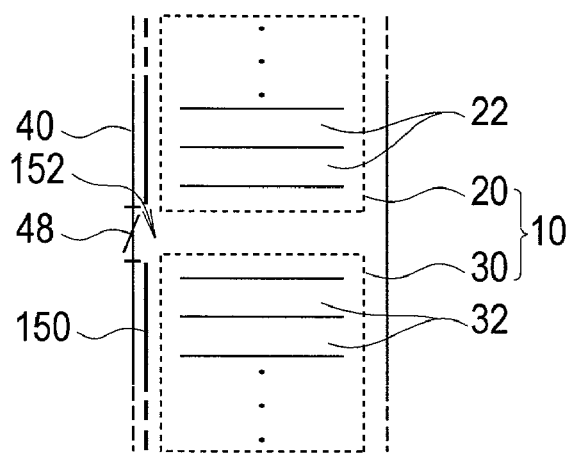
FIG. 6 (including FIG. 6(A) and FIG. 6(B)) consists of schematic diagrams illustrating the features of structural examples of the heating and cooling apparatus of this invention.

Alternatively, in some cases, stationary partition or dividers 154 can be provided to the non-communicating substrate holding spaces 23 and 35, away from these chambers, with the position across from the gate valve 48 being an opening, just as in FIG. 6(A).

Figure 6B:
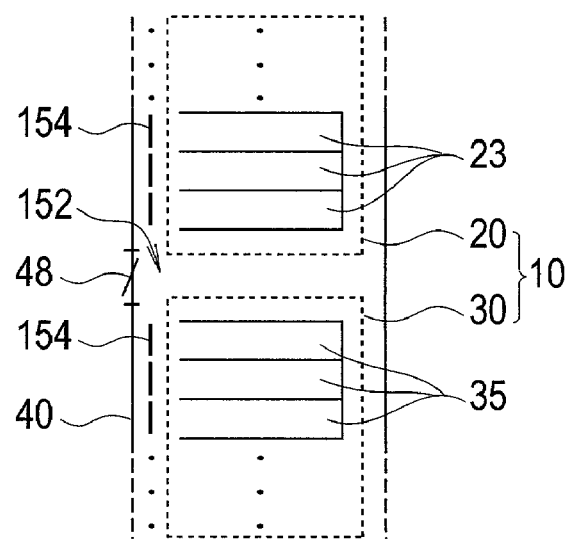

In the structural example shown in FIG. 6(B), these dividers 154 are provided at locations corresponding to openings on one side (the left side in the drawing) of the non-communicating substrate holding spaces 23 and 35, independently and apart from each other. Naturally, these dividers can be similarly provided to the communicating substrate holding spaces.

This invention is also applicable to structures other than the structural examples described with reference to FIGS. 2 to 6. For instance, as is clear from the structural examples given below, an openable and closable door or a gate valve can be provided so as to seal off the substrate holding spaces.

Next, specific examples of the structure of this invention will be described with reference to FIGS. 7 to 13. FIGS. 7 to 10 are simplified schematic diagrams illustrating examples of the structure of a heating and cooling apparatus.

Figure 7:
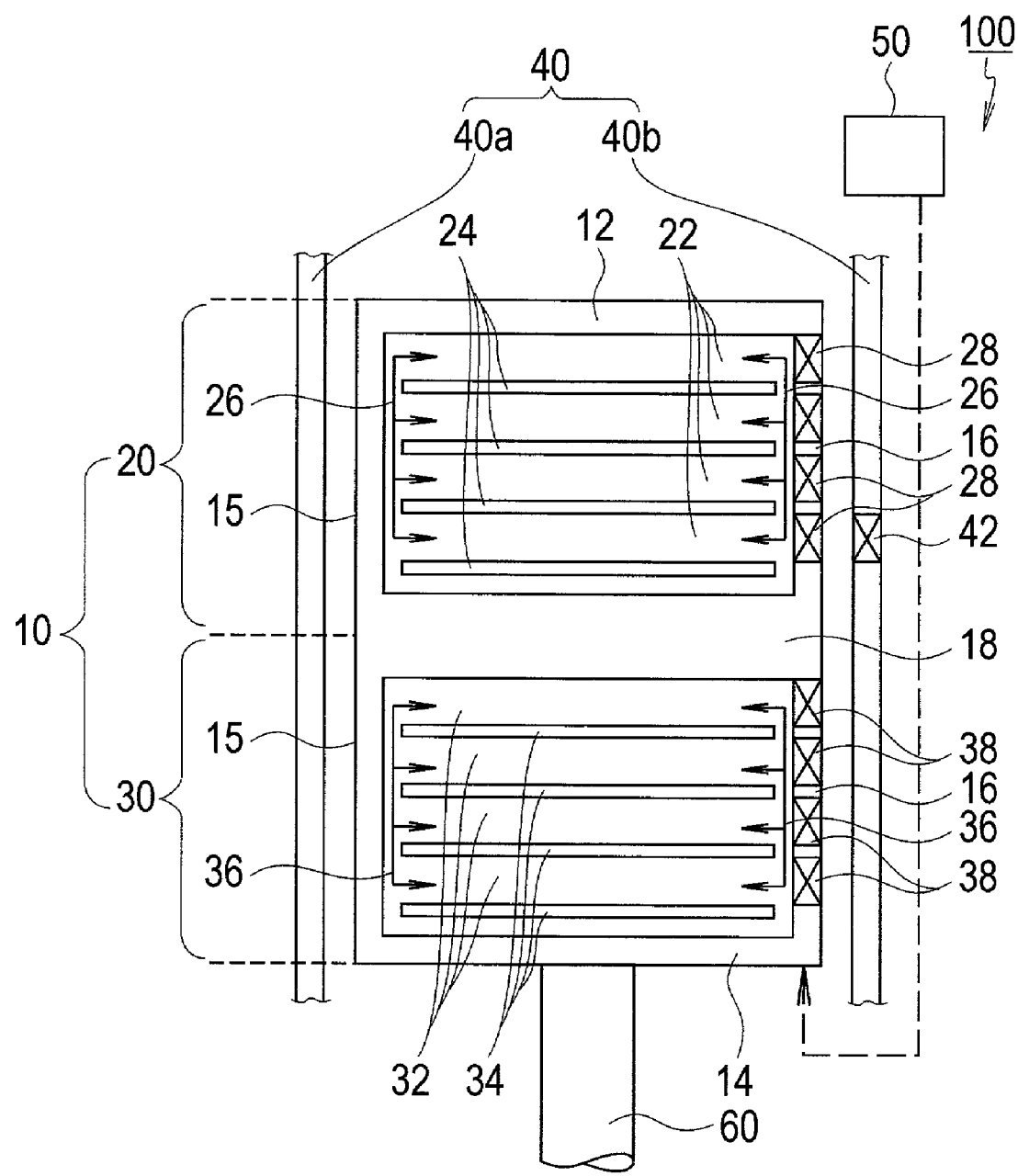
FIG. 7 is a schematic diagram illustrating a first structural example of this invention.

In the structural example shown in FIG. 7, the substrate heat treatment chamber 10 (also called a heating and cooling chamber) 10 of the heating and cooling apparatus 100 is separated vertically inside the vacuum processing chamber 40. In this example, the substrate heating chamber 20 is on the top, and the substrate cooling chamber 30 is on the bottom, with the two chambers communicating. In FIG. 7, portions of the walls of the vacuum processing chamber 40 are labeled 40*a* and 40*b*. The substrate heat treatment chamber 10 is formed overall as a single container.

In the structural example shown in FIG. 7, the container and the vacuum processing chamber are quadrangular in shape. In the drawing, 12 is the ceiling of the substrate heating and cooling chamber 10, 14 is the bottom, 15 is the left wall, and 16 is the right wall. In this structural example, the inside of the container chamber is divided by a wall in the lateral direction (called a lateral wall or partition or divider) 18, and this divider 18 is used as a shielding means to partition the inside of the container chamber into the substrate heating chamber 20 on the top and the substrate cooling chamber 30 on the bottom, and to thermally shield, or isolate, these chambers 20 and 30.

Therefore, the substrate heating chamber 20 is surrounded by the ceiling 12, the lateral wall 18, the left wall 15, the right wall 16, and front and rear walls (not shown in the drawings). Meanwhile, the substrate cooling chamber 30 is surrounded by the bottom 14, the lateral wall 18, the left wall 15, the right wall 16, and front and rear walls (not shown). In order to improve the thermal insulation effect, it is preferable in this case for all of part of the inner walls of the heating chamber 20 and the cooling chamber 30 to be formed from a material with excellent thermal insulation properties.

It is also preferable for the substrate heating chamber 20 and/or the substrate cooling chamber 30 to be divided into a plurality of substrate holding spaces 22 and 32 that communicate with each other. The dividers 24 and 34 in this case can be, for example, shelves appropriately provided to the container side walls. These substrate holding spaces 22 and 32 are preferably designed so that the substrates can be held in a state of being supported by a substrate support (called a tray; not shown). It is also possible for the substrate holding spaces 22 and 32 to be such that the substrates held in these holding chambers are heated or cooled all at once in the heating chamber 20 or the cooling chamber 30.

The above-mentioned heating and cooling apparatus 100 is equipped with a heating and cooling control means 50 for controlling the heating in the substrate heating chamber 20 or the cooling in the substrate cooling chamber 30. In the structural example in FIG. 7, the heating and cooling chambers 20 and 30 are designed so that their respective substrate holding spaces 22 and 32 are thermally controlled all at once with a heating gas 26 or cooling gas 36, for example. Accordingly, while not shown in FIG. 7, a gas supply and exhaust system for supplying and exhausting the heating gas, a temperature control system for controlling the temperature inside the heating chamber 20 and therefore the substrate holding space 22, or the like can be provided as a heating control means for the substrate heating chamber 20. Similarly, while not shown in FIG. 7, a gas supply and exhaust system for supplying and exhausting the cooling gas, a temperature control system for controlling the temperature inside the cooling chamber 30 and therefore the substrate holding space 32, or the like can be provided as a cooling control means for the substrate cooling chamber 30.

This heat treatment may be performed by a heater, a heating or cooling pipe, a heat pump, or another direct or indirect, suitable heating or cooling means 50.

The vacuum processing chamber 40 incorporating the above-mentioned substrate heat treatment chamber (heating and cooling chamber) 10 is normally adjacent to another vacuum processing chamber, such as a deposition chamber, in which case gate valves may be provided to the various vacuum processing chambers, just as in the past. The heat treatment chambers 20 and 30 of the heating and cooling chamber 10 are able to hold numerous substrates simultaneously, so doors 28 and 38 are provided to the substrate holding spaces 22 and 32 in order to facilitate the movement of these substrates in and out. These doors 28 and 38 may be provided at one or more places for each of the substrate holding spaces 22 and 32. In the structural example shown in FIG. 7, the doors 28 and 38 are provided to the right wall 16 on the side facing one of the walls, 40*b*, of the vacuum processing chamber 40. The wall 40*b* of the vacuum processing chamber 40 is provided with a gate valve 42 at a suitable location. The door 28 or 38 and the gate valve 42 must be located across from the place where the substrates are moved in and out. Therefore, an elevator apparatus, such as a rod mechanism 60 that moves up and down hydraulically or by means of a motor, is provided for moving the heating and cooling chamber 10 up and down.

With the above-mentioned structural example of FIG. 7, the substrate heating chamber 20 and the substrate cooling chamber 30 are provided independently inside a single vacuum processing chamber 40 that is independent of the vacuum processing chambers in which other processing is performed.

Therefore, if numerous substrates to be subjected to batch heat treatment are disposed in the substrate holding spaces 22 and/or 32 of the substrate heating chamber 20 and the substrate cooling chamber 30, respectively, the heating and cooling of the substrates can be carried out separately and in parallel with other deposition processing, and these heat treatments (heating and cooling) can also be carried out simultaneously.

Also, throughput is raised since other processing besides heating and cooling is carried out in different chambers from those in which the substrates are heated and cooled. Also, because the substrate heating chamber 20 and the substrate cooling chamber 30 are provided independently within a single vacuum processing chamber 40 that is separate from the vacuum processing chambers in which other processing besides heating and cooling is performed, not only the heating and cooling apparatus 100, but also the vacuum processing apparatus equipped with this apparatus 100 can be made more compact and energy-efficient.

Next, another structural example of the heating and cooling apparatus 100 of this invention will be described through reference to FIG. 8. In the structural example of FIG. 8, the inside of the container of the substrate heat treatment chamber 10 is partitioned by a vertical wall, namely, the vertical wall 17, so as to allow thermal shielding, and the substrate heating chamber 20 and the substrate cooling chamber 30 are divided laterally. Accordingly, the doors 28 and 38 that are used to facilitate moving the substrates in and out are each provided at one place in each of the substrate holding spaces 22 and 32 of the substrate heating chamber 20 and the substrate cooling chamber 30, respectively, and gate valves 42 are provided one each to the walls 40*a* and 40*b* on either side of these substrate holding spaces 22 and 32. The rest of the structure can be the same as the structure illustrated in FIG. 7 as needed, and will therefore not be described again.

Figure 9:
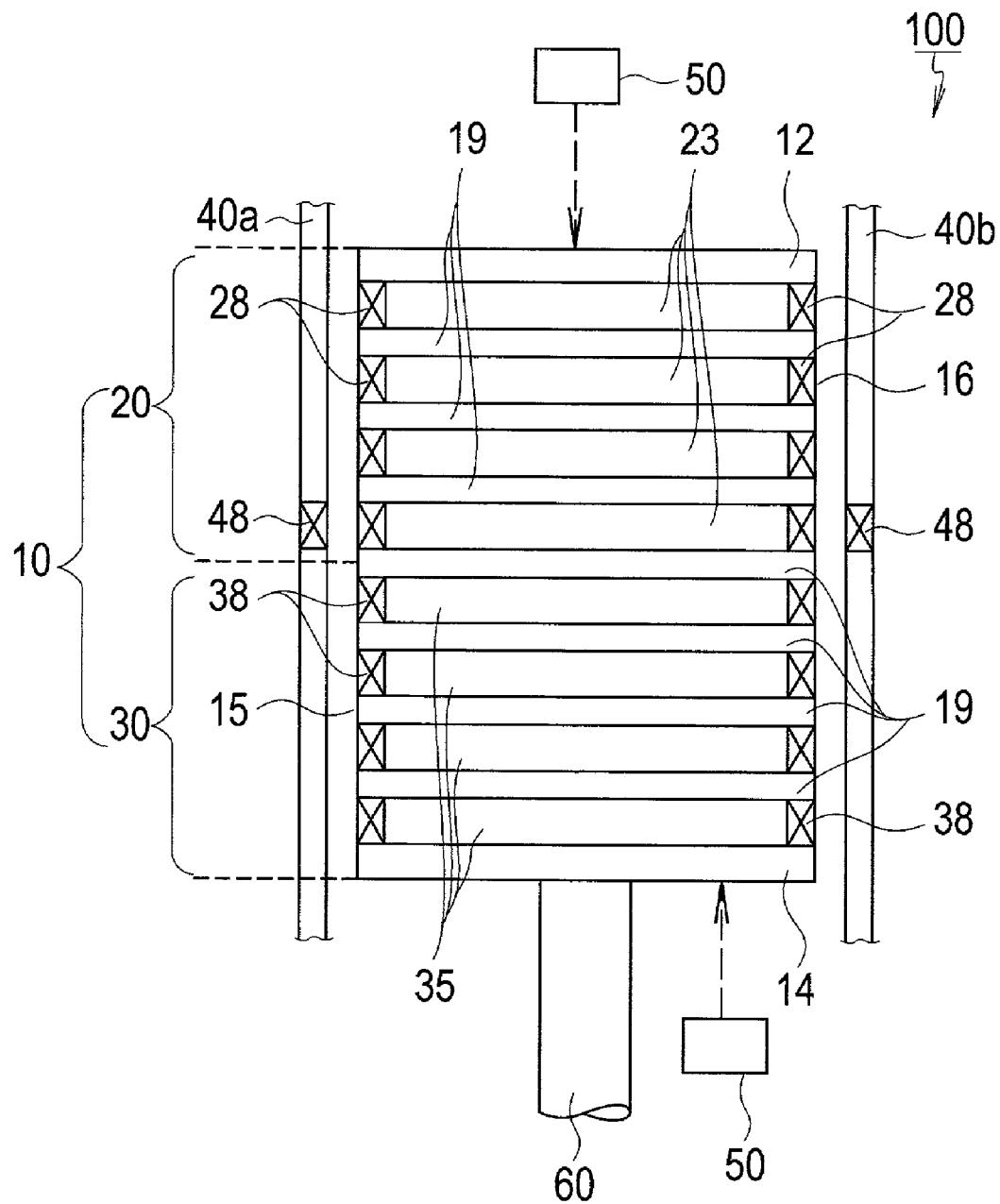
FIG. 9 is a schematic diagram illustrating a third structural example of this invention.

FIG. 9 is a diagram illustrating another preferred structural example of the heating and cooling apparatus 100 of this invention. In this structural example, a plurality of substrate holding spaces 23 and 35 that do not communicate with each other are provided to the substrate heating chamber 20 and/or the substrate cooling chamber 30.

Accordingly, a plurality of lateral walls 19 are provided inside the chamber of the container 10 of this apparatus 100 to partition the plurality of substrate holding spaces 23 and 35 and thermally shield them from one another.

With these lateral walls, just as with the structural example in FIG. 7, at least the inner walls on the substrate holding space side are preferably formed from a material with good thermal insulation properties. Since the substrate holding spaces 23 and 35 are thermally shielded or isolated and independent from each other, heating or cooling in the various chambers must be performed independently. Accordingly, a heating control means 50 that is the same as that described in the structural example shown in FIG. 7 is provided to the substrate holding space 23 of the substrate heating chamber 20 and to the substrate holding space 35 of the substrate cooling chamber 30. Thus providing a heating or cooling means separately to the substrate holding space 23 or 35 allows the temperatures in the chambers to be controlled independently, which makes it possible to perform the appropriate heat treatment on the substrates being held.

Also, in the structural example shown in FIG. 9, the doors 28 and 38 are provided at two places to each of the substrate holding spaces 23 and 35. Accordingly, one gate valve 48 is also provided to each of the walls 40a and 40b of the vacuum processing chamber 40 corresponding to the above-mentioned gate valves. While not shown in the drawings, the locations of the gate valves 48 provided to the walls 40a and 40b may be at the same or different levels vertically. If the levels are different, then one gate valve 48 can be used exclusively for the substrate heating chamber 20, and the other gate valve 48 can be used exclusively for the substrate cooling chamber 30. These gate valves 48 may also be provided to the same or different walls. The rest of the structure can be the same as the structure illustrated in FIGS. 7 and 8 as needed, and will therefore not be described again.

Figure 10:
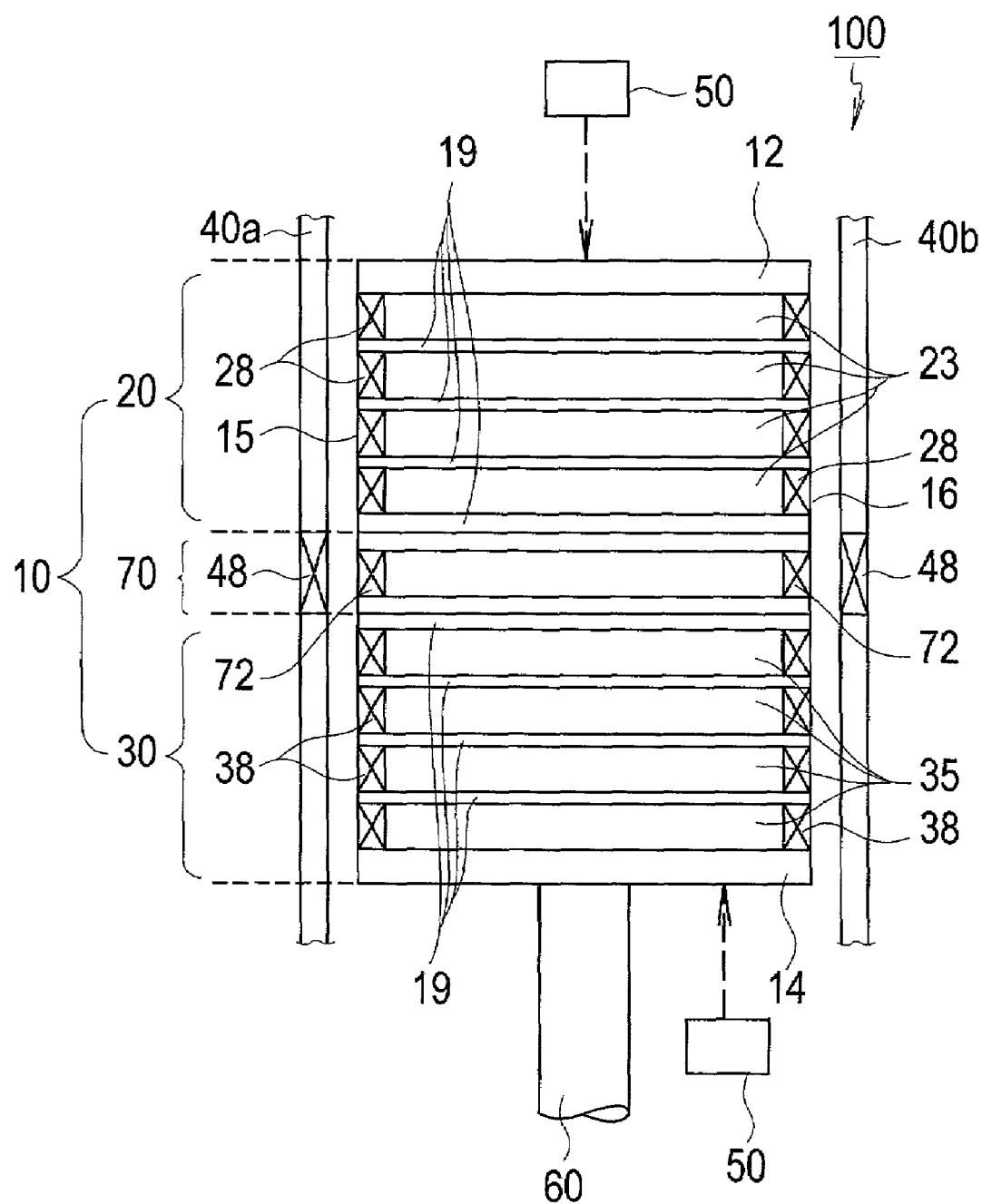
FIG. 10 is a schematic diagram illustrating a fourth structural example of this invention.

FIG. 10 is a diagram illustrating another structural example of the heating and cooling apparatus 100 of this invention. The difference between the structural example in FIG. 10 and the structural example in FIG. 9 is that a substrate transportation chamber 70 used for substrates that require no heating and cooling is provided between the substrate heating chamber 20 and the substrate cooling chamber 30. This substrate transportation chamber 70 is thermally shielded or isolated from the substrate heating chamber 20 and the substrate cooling chamber 30 above and below. At least one door 72 is provided to this substrate transportation chamber 70 as well. In the example shown here, the doors 72 are provided on both sides of the substrate transportation chamber 70.

With this structure, substrates that require no heating or cooling can be shunted to the substrate transportation chamber 70 of the vacuum processing chamber 40, or moved to the outside via this vacuum processing chamber 40, which allows the apparatus to be even more compact.

The substrate transportation chamber 70 also keeps the substrates that require no heating or cooling from being affected by the heat treatments conducted in the substrate heating chamber 20 and the substrate cooling chamber 30.

Figure 8:
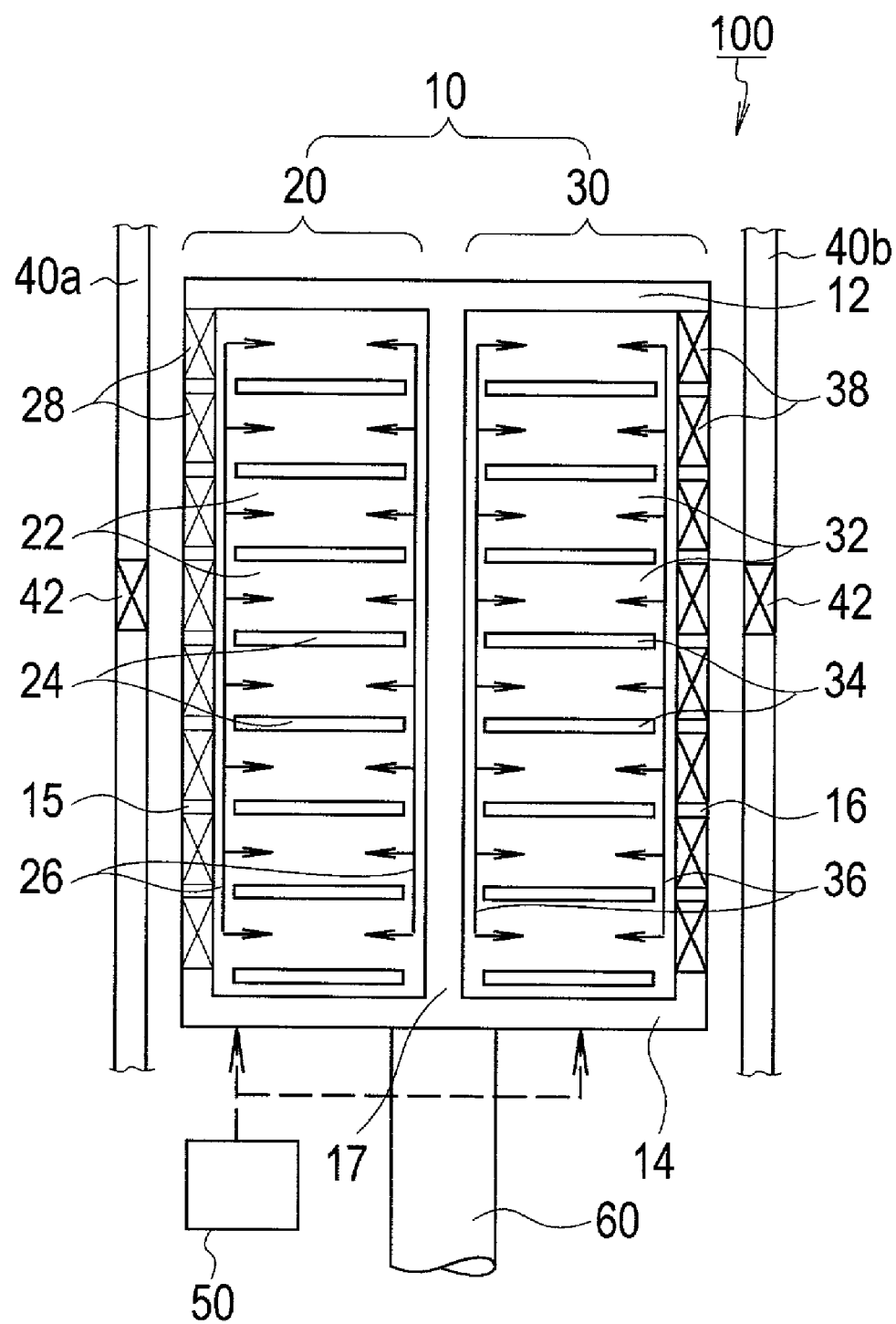
FIG. 8 is a schematic diagram illustrating a second structural example of this invention.

A substrate transportation chamber similar in nature to this substrate transportation chamber 70 can also be provided as needed to the structural examples in FIGS. 7 and 8 as dictated by the design.

The rest of the structure can be the same as the structure illustrated in FIGS. 7, 8, and as needed, and will therefore not be described again.

Figure 11:
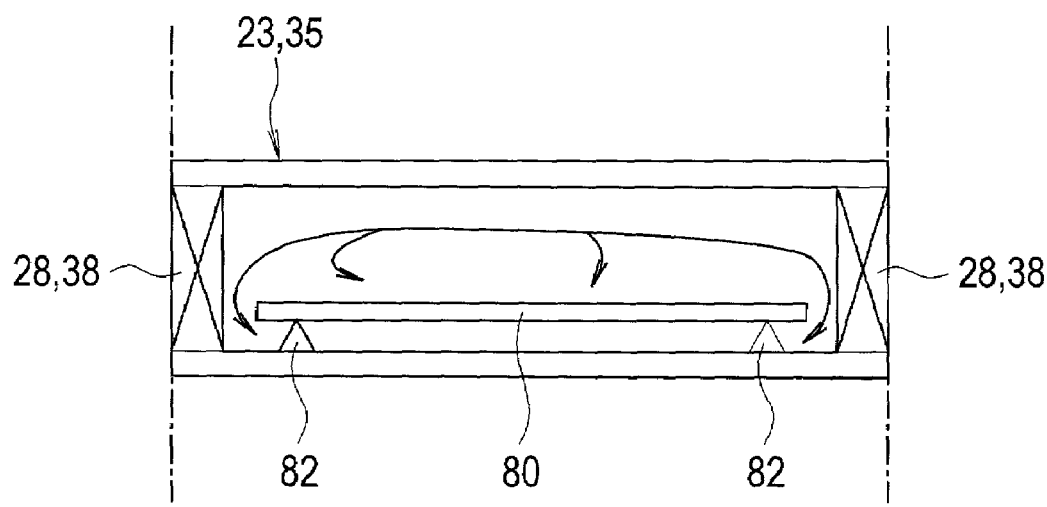
FIG. 11 is a schematic diagram illustrating an example of the heating and cooling method in the substrate holding spaces (or sections) of the heating and cooling apparatus of this invention.
Figure 12:
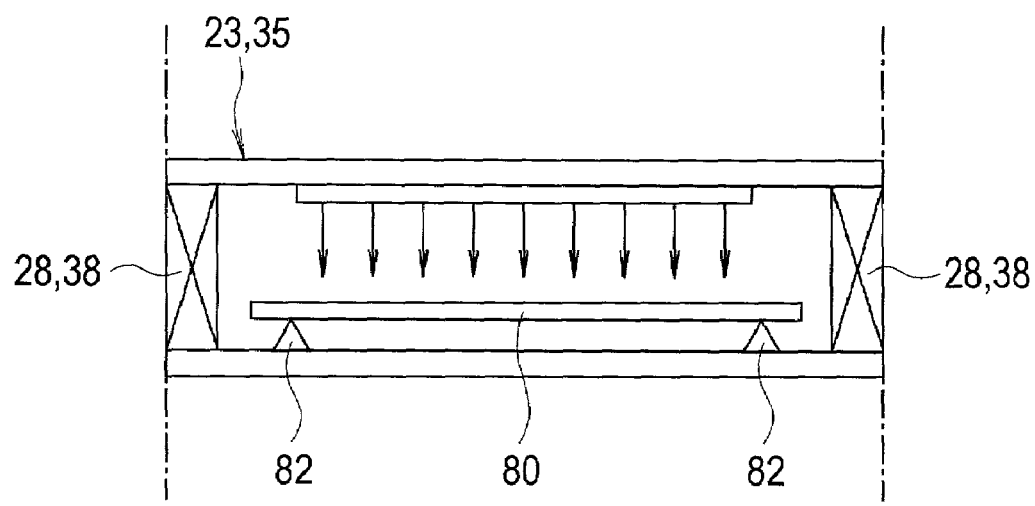
FIG. 12 is a schematic diagram illustrating another example of the heating and cooling method in the substrate holding spaces (or sections) of the heating and cooling apparatus of this invention.

FIGS. 11 and 12 are diagrams illustrating the heating and cooling method in the non-communicating individual substrate holding spaces 23 and 25. A substrate 80 is held in each of the substrate holding spaces 23 and 35 via a suitable support means 82.

Just as described for the structural example in FIG. 7, the example shown in FIG. 11 illustrates a method for heating or cooling the substrate 80 by providing a gas supply and exhaust system to the substrate holding space 23 or 35 and circulating a gas from the outside. FIG. 12 illustrates a method for heating or cooling the substrate 80 by attaching a heat pump or other suitable heating or cooling means to the substrate holding space and heating or cooling the substrate 80 by radiation.

With the structure shown in FIG. 11 or 12, it is possible to individually heat the substrate 80 held in the non-communicating substrate holding space 23 of the substrate heating chamber 20 and/or to individually cool the substrate 80 held in the non-communicating substrate holding space 35 of the substrate cooling chamber 30.

The heating and cooling method described through reference to FIGS. 11 and 12 can be favorably applied not only to the non-communicating substrate holding spaces 23 and 35, but also to the communicating substrate holding spaces 22 and 32.

Figure 13D:
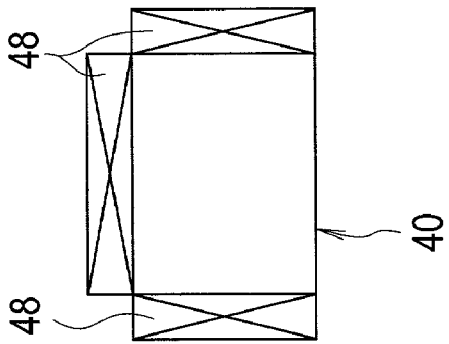
FIG. 13 consists of schematic diagrams illustrating the number of gate valves provided to the substrate holding spaces (or sections) of the heating and cooling apparatus of this invention.
Figure 13C:
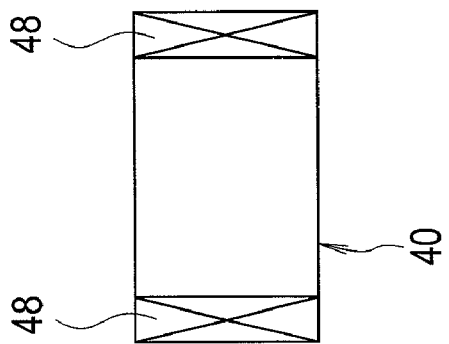
Figure 13B:
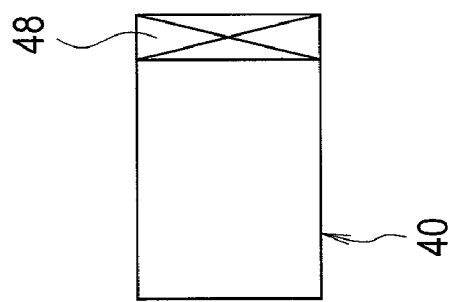
Figure 13A:
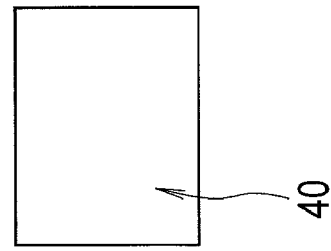

FIGS. 13(A), (B), (C), and (D) are diagrams illustrating the number of gate valves 48 provided to the vacuum processing chamber 40. How the gate valves are provided to the vacuum processing chamber is determined by where the vacuum processing chamber of this heating and cooling apparatus is disposed in the vacuum processing apparatus. In the example shown in FIG. 13(A), no gate valve is provided around the vacuum processing chamber. In the example shown in FIG. 13(B), one gate valve is provided around the vacuum processing chamber. In the example shown in FIG. 13(C), one gate valve is provided to each of the two side walls facing each other around the vacuum processing chamber. In the example shown in FIG. 13(D), one gate valve is provided to each of three side walls around the vacuum processing chamber. Thus the required separation chamber, loading chamber, and other vacuum processing chambers can be disposed around the vacuum processing chamber as dictated by the design.

Gate valves are provided at three places in the structural example shown in FIG. 13(D), and in actual practice, a gate valve can be attached at one or two places out of the three on the vacuum processing chamber, and the remaining place or places can be readied for the attachment of a gate valve and a blank flange temporarily attached at this place or places. In this case, the gate valves are attached as in the structural example shown in FIG. 13(B) or (C).

In the structural examples described with reference to FIGS. 7 to 10, the substrate is placed in a direction perpendicular to the direction of movement of the substrate holding space, that is, the substrate is laid horizontally, but placing the substrate parallel (vertically) or at an angle to the direction of movement of the substrate holding space, that is, designing the substrate holding space so that the substrate is placed standing up, can also be favorably applied to this invention instead. If the substrate is standing up, though, the vacuum processing chamber 40 will take up somewhat more surface area than when the substrate is laid horizontally. Nevertheless, since the separation chamber or vacuum processing chambers for deposition or sputtering will also be vertical, they will each take up less space, and accordingly the vacuum processing apparatus as a whole will take up less space, making the apparatus itself more compact.

In the structural example described with reference to the above-mentioned FIGS. 7 to 13, the doors 28 and 38 were provided to the substrate transportation ports of the substrate holding spaces 22, 23, 32, and 35, but if a tighter seal is required, then gate valves can be provided at the substrate transportation ports of the substrate holding spaces 22, 23, 32, and 35 instead of providing doors.

When the above-mentioned doors are used, it is favorable, for example, if the structure is such that these doors are opened by mechanical or electromagnetic action when a substrate holding space for a substrate that needs to be transported in or out is stopped after moving to a position across from the substrate transportation port of the vacuum processing chamber 40, and these doors are closed when the substrate transportation is concluded and the substrate holding space is to be moved. In this case, the opening and closing of these doors can be controlled as dictated by the design.

The type of substrate used in this invention is not limited in any way, but it is favorable for the substrates to be treated in the substrate heat treatment chamber to be glass substrates. If they are, liquid crystal devices can be formed in a shorter time and at a higher yield from these glass substrates.

As is clear from the above description, with the heating and cooling apparatus of this invention, batch processing involving simultaneous heating and cooling in the same vacuum processing chamber is possible and throughput can be increased, and furthermore the apparatus can be more compact energy-efficient.

Also, with the heating and cooling apparatus of this invention, the heat treatment temperatures for various substrates are set independently and batch processing involving simultaneous heating and cooling in the same vacuum processing chamber is possible and throughput can be increased, and furthermore the apparatus can be more compact energy-efficient.

Finally, the vacuum processing apparatus of this invention possesses the features of any of the heating and cooling apparatus discussed above, and the effects thereof are realized.

What is claimed is:

1. A heating and cooling apparatus for substrates comprising:
    a substrate
    a substrate heating chamber which heats the substrate,
    a substrate cooling chamber which cools the substrate,
    a single vacuum processing chamber which accommodates both of the substrate heating chamber and the substrate cooling chamber,
    a plurality of substrate holding spaces, which do not communicate with one another, provided in at least one of said substrate heating chamber and said substrate cooling chamber; and
    a heating and cooling control means for
        enabling at least one of individual heating of any substrates held in said non-communicating substrate holding spaces of said substrate heating chamber and individual cooling of any substrates held in said non-communicating substrate holding spaces of said substrate cooling chamber.

2. A vacuum processing apparatus comprising:
    a loading chamber adapted to load and unload substrates, and pump an interior of the loading chamber to a required pressure,
    a separation chamber adapted to transport
    a heating and cooling device which is separate from the loading chamber and which is configured to receive the substrates from the loading chamber or the separation chamber;
    wherein the heating and cooling device comprises:
    a substrate heating chamber configured to heat the substrates,
    a substrate cooling chamber configured to cool the substrates, and
    a single vacuum processing chamber which accommodates both of the substrate heating chamber and the substrate cooling chamber.

3. The vacuum processing apparatus according to claim 2, further comprising thermal shielding to thermally shield said substrate heating chamber and said substrate cooling chamber from one another within said vacuum processing chamber.

4. The vacuum processing apparatus according to claim 2, wherein
    a substrate that is in said heating chamber is a glass substrate.

5. The vacuum processing apparatus according to claim 2, further comprising a plurality of substrate holding spaces, which do not communicate with one another, provided in at least one of said substrate heating chamber and said substrate cooling chamber.

6. The vacuum processing apparatus according to claim 2, wherein
    said substrate heating chamber comprises at least one opening and closing valve for transporting substrates in and out of substrate heating chamber.

7. The vacuum processing apparatus according to claim 2, wherein the heating and cooling device is disposed between the loading chamber and the separation chamber.

8. The vacuum processing apparatus according to claim 2, further comprising at least two separation chambers, the heating and cooling device being arranged between one separation chamber and another separation chamber.

9. The vacuum processing apparatus according to claim 2, wherein the heating and cooling device further comprises a substrate transportation chamber which is thermally shielded from the substrate heating chamber and the substrate cooling chamber, and through which substrates pass from the loading or separation chambers to the other.

10. The vacuum processing apparatus according to claim 9, further comprising thermal shielding to thermally shield said substrate heating chamber and said substrate transportation chamber from one another, and second thermal shielding to thermally shield said substrate cooling chamber and said substrate transportation chamber from one another.

11. The vacuum processing apparatus according to claim 2, wherein the heating and cooling device is partitioned into two parts by a vertical wall which thermally shields the two parts, the substrate heating chamber disposed in one of the parts, and the substrate cooling chamber disposed in the other part.

12. The vacuum processing apparatus according to claim 2, further comprising:
    a plurality of substrate holding spaces, which do not communicate with one another, provided in at least one of said substrate heating chamber and said substrate cooling chamber; and
    a heating and cooling controller for
        enabling at least one of individual heating of any substrates held in said non-communicating substrate holding spaces of said substrate heating chamber; or
        individual cooling of any substrates held in said non-communicating substrate holding spaces of said substrate cooling chamber.

* * * * *